United States Patent
Nguyen et al.

(10) Patent No.: US 9,779,781 B1
(45) Date of Patent: Oct. 3, 2017

(54) MEMORY MODULE BATTERY BACKUP

(71) Applicant: HEWLETT PACKARD ENTERPRISE DEVELOPMENT LP, Houston, TX (US)

(72) Inventors: Hai Nguyen, Houston, TX (US); Daniel Hsieh, Taipei (TW); Abhishek Banerjee, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/331,028

(22) Filed: Oct. 21, 2016

(51) Int. Cl.

| | |
|---|---|
| G11C 5/14 | (2006.01) |
| H02J 1/10 | (2006.01) |
| G06F 1/30 | (2006.01) |
| H02J 9/04 | (2006.01) |
| H02J 3/32 | (2006.01) |
| G11C 11/4074 | (2006.01) |
| G06F 11/20 | (2006.01) |
| G11C 11/16 | (2006.01) |
| H02J 7/02 | (2016.01) |

(52) U.S. Cl.
CPC .............. G11C 5/141 (2013.01); H02J 9/04 (2013.01); *G06F 11/2015* (2013.01); *G11C 11/1697* (2013.01); *G11C 11/4074* (2013.01); *H02J 3/32* (2013.01); *H02J 7/022* (2013.01)

(58) Field of Classification Search
CPC . G11C 5/141; G11C 11/4074; G11C 11/1697; G06F 11/2015; H02J 9/04; H02J 3/32; H02J 7/022
USPC ..................................... 365/229; 307/23, 64
See application file for complete search history.

(56) References Cited

U.S. PATENT DOCUMENTS

| | | | |
|---|---|---|---|
| 4,143,283 | A | 3/1979 | Graf et al. |
| 4,884,242 | A | 11/1989 | Lacy et al. |
| 5,677,890 | A | 10/1997 | Liong et al. |
| 5,784,548 | A | 7/1998 | Liong et al. |
| 7,282,814 | B2 | 10/2007 | Jacobs |
| 8,154,258 | B2 | 4/2012 | Pappas et al. |
| 9,431,067 | B2 | 8/2016 | Ohwada et al. |
| 2004/0190210 | A1* | 9/2004 | Leete .................. G06F 1/30 361/90 |
| 2008/0164761 | A1* | 7/2008 | O'Bryant ............ H02J 9/061 307/66 |
| 2010/0293326 | A1* | 11/2010 | Sewall ............. G06F 1/3275 711/106 |
| 2011/0006600 | A1* | 1/2011 | Fontana .............. H02J 1/10 307/25 |

(Continued)

OTHER PUBLICATIONS

Stack Exchange Inc., "How To Do Redundancy for a DC/DC Converter? So That If One of the Converters Fails the Other Gets Switched On," (Web Page), May 14, 2015, 2 pages, available at http://electronics.stackexchange.com/questions/170460/how-to-do-redundancy-for-a-dc-dc-converter-so-that-if-one-of-the-converters-fai.

*Primary Examiner* — Ly D Pham
(74) *Attorney, Agent, or Firm* — Hewlett Packard Enterprise Patent Department

(57) ABSTRACT

Examples disclosed herein relate to dual in-line memory module (DIMM) battery backup. Some examples disclosed herein describe systems that include a backup power source pluggable into a DIMM slot. The backup power source may include a plurality of battery cells electrically connected to a DIMM to provide backup power to the DIMM. Each of the plurality of battery cells supporting the DIMM may be electrically connected to a DC-to-DC converter in series and to each other in parallel.

20 Claims, 7 Drawing Sheets

(56) References Cited

U.S. PATENT DOCUMENTS

| | | | |
|---|---|---|---|
| 2011/0089898 A1* | 4/2011 | Lee | H02J 7/0016 |
| | | | 320/116 |
| 2013/0057223 A1* | 3/2013 | Lee | H02J 7/0021 |
| | | | 320/136 |
| 2014/0042815 A1* | 2/2014 | Maksimovic | H02J 1/00 |
| | | | 307/63 |
| 2014/0312828 A1* | 10/2014 | Vo | H01M 10/4257 |
| | | | 320/103 |
| 2015/0048796 A1* | 2/2015 | Sherstyuk | H01M 10/425 |
| | | | 320/129 |
| 2015/0067362 A1* | 3/2015 | Sultenfuss | G06F 1/3296 |
| | | | 713/320 |

* cited by examiner

MEMORY MODULE BATTERY BACKUP

BACKGROUND

Memory modules, such as dual in-line memory modules (DIMMs), may include a plurality of random access memory (RAM) cells for storing data and/or instructions associated with a computing system.

BRIEF DESCRIPTION OF THE DRAWINGS

The following detailed description references the drawings, wherein.

DETAILED DESCRIPTION

Figure 1:
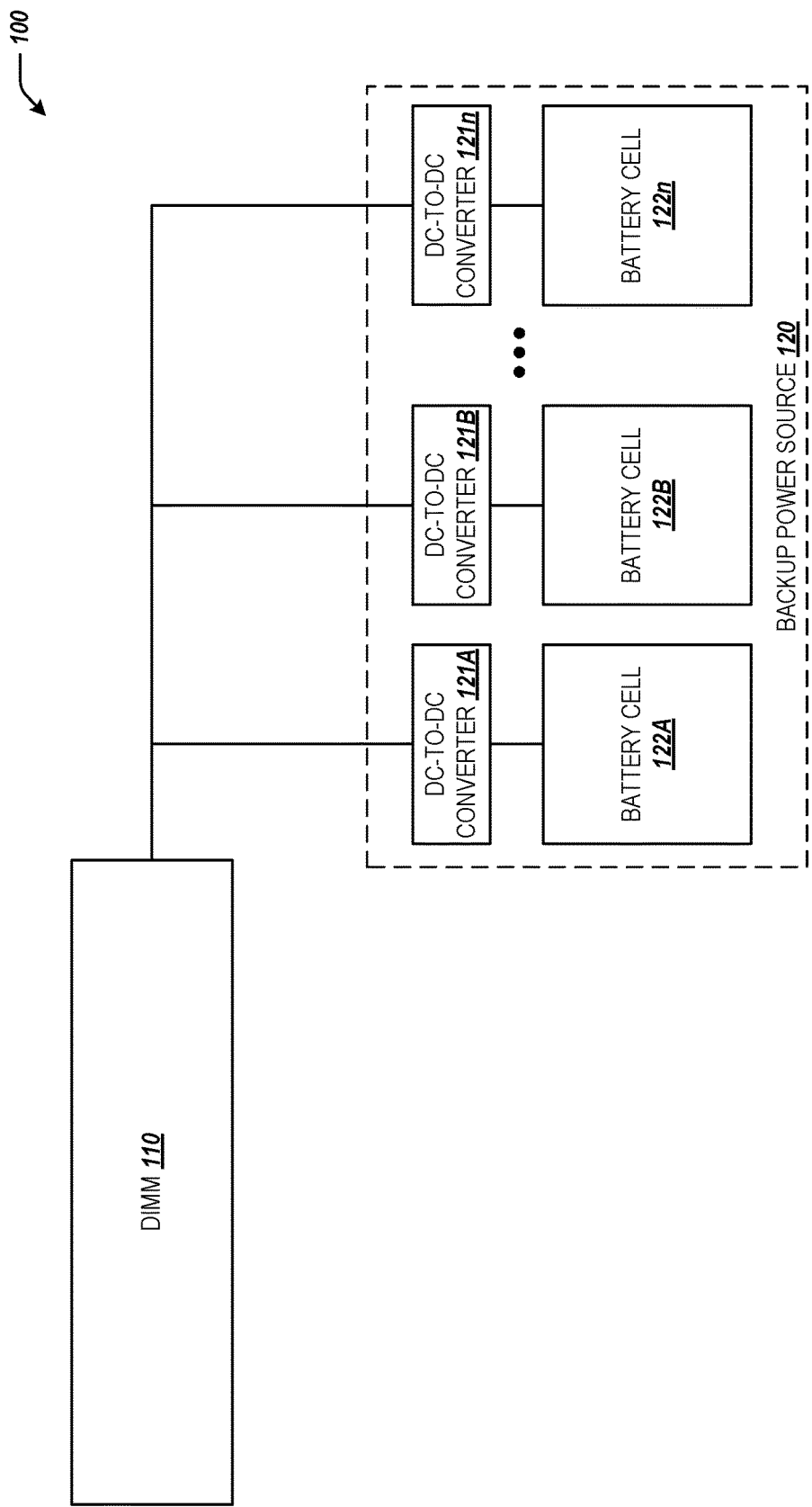
FIG. 1 is a block diagram of an example system for DIMM battery backup.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing particular examples only and is not intended to be limiting. As used herein, the singular forms "a," "an," and "the" are intended to include the plural forms as well, unless the context clearly indicates otherwise. The term "plurality," as used herein, is defined as two or more than two. The term "another," as used herein, is defined as at least a second or more. The term "coupled," as used herein, is defined as connected, whether directly without any intervening elements or indirectly with at least one intervening elements, unless otherwise indicated. Two elements can be coupled mechanically, electrically, or communicatively linked through a communication channel, pathway, network, or system. The term "and/or" as used herein refers to and encompasses any and all possible combinations of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

In some implementations, RAM cells included on a memory module may be volatile, and thus a power source may be used to supply power to the RAM cells in order for the RAM cells to retain information stored therein. Due to the nature of volatile RAM cells, a loss of power to the memory module (e.g., as a result of power source failure) may result in a loss of information stored in the RAM cells.

To prevent the loss of information in the absence of power, a computing system may include a backup power source that supplies backup power to a memory module in the event that the main power source fails. One example implementation of a backup power source may include a plurality of battery cells electrically connected in series to provide backup power to a memory module (or a plurality of memory modules in parallel) in response to a loss of input voltage to the memory module(s).

Series-connected battery backup solutions have a number of drawbacks. For example, series-connected battery backup sources may be prone to single-point failures. That is, if one cell in the series fails, the entire backup power source may fail as a result. Moreover, cells in series-connected backup sources may be prone to premature single-point failures due to differences in cell capacity (referred to as cell mismatch) and/or differences in levels of charge. For example, a plurality of battery cells connected in series may cease discharging prematurely when a weak cell (i.e., a cell that has lower storage capacity compared to the other cells) runs out of charge before the other cells. To prevent premature cell failures due to cell mismatch, cells in a series-connected backup source may be matched with cells of similar capacity. Cell matching, however, adds additional manufacturing cost which in turn adds to the overall cost of the backup power solution. Another solution to cell mismatch is to balance (either passively or actively) the overall load across the series-connected cells such that each of the cells reaches depletion at a similar time. However, passive balancing may be an inefficient solution because energy from higher-capacity cells is wasted through heat dissipation to ensure that higher capacity cells deplete at similar times as lower capacity cells. Moreover, active balancing adds complexity to battery backup solutions by using high-power DC-DC converters to transfer charge from higher capacity cells to lower capacity cells.

Examples disclosed herein provide technical solutions to these technical challenges by providing memory module battery backup systems. In some of the disclosed examples, a plurality of battery cells may be electrically connected to a DIMM to provide backup power to the DIMM. Each of the plurality of battery cells may be electrically connected to a DC-to-DC converter in series and each of the plurality of battery cells being electrically connected to each other in parallel. The parallel connection of the battery cells allows the remaining cells to continue supporting the DIMM load even after cells in the plurality of cells fail. Accordingly, the example DIMM battery backup systems disclosed herein may prevent single-point failures in addition to reducing power consumption, providing individual load control, and eliminating the use of cell matching and balancing.

FIG. 1 is a block diagram of an example computing system 100 for memory module battery backup. Computing system, as used herein, may refer to computing systems such as, for example, a laptop, a desktop, an all-in-one device, a thin client, a workstation, and various types of server devices (e.g., blade servers, rack-mount servers, server appliances, etc.).

As shown in FIG. 1, computing system 100 may include various components, such as at least one DIMM 110 and a backup power source 120 including a plurality of DC-to-DC converters 121A-121*n* and a plurality of battery cells 122A-

122*n*. The number and arrangement of these components is an example only and provided for purposes of illustration. Other arrangements and numbers of components may be utilized without departing from the examples of the present disclosure. For example, system 100 may include more or fewer DIMMs, DC-to-DC converters, and/or battery cells. As another example, DIMM 110 may be implemented as other types of memory modules, such as a single in-line memory module (SIMM).

DIMM 110 may include various types of volatile RAM, such as dynamic RAM (DRAM), synchronous DRAM (SDRAM), various types of double data rate (DDR) SDRAM (e.g., DDR, DDR2, DDR3, DDR4, etc.), or any combination thereof. DIMM 110 may also be implemented as a small outline DIMM (SODIMM) or a Rambus DIMM (RDIMM) (e.g., a DIMM that includes Rambus DRAM (RDRAM)). In some implementations, DIMM 110 may be a non-volatile DIMM (NVDIMM).

As stated above, backup power source 120 may include a plurality of DC-to-DC converters 121A-121*n* and a plurality of battery cells 122A-122*n*. Each of DC-to-DC converters 121A-121*n* may be electrically connected to one of battery cells 122A-122*n* in series. In some implementations, each of DC-to-DC converters 121A-121*n* may have the same power rating. In some implementations, at least two of DC-to-DC converters 121A-121*n* (e.g., DC-to-DC converter 121A and DC-to-DC converter 121B) may have different power ratings. In some implementations, each of DC-to-DC converters 121A-121*n* may have different power ratings.

In some implementations, backup power source 120 may be a circuit card assembly that is pluggable into a DIMM slot of computing system 100. DC-to-DC converters 121A-121*n* and/or battery cells 122A-122*n* may be mounted on the circuit card assembly. When mounted in a DIMM slot of computing system 100, backup power source 120 may provide backup power to DIMM 110. In some implementations, backup power source 120 may be implemented by electrical circuitry integrated into a motherboard of computing system 100. In some implementations, backup power source 120 may be implemented by electrical circuitry integrated into a circuit card assembly that is mounted on a motherboard of computing system 100.

DIMM 110 may be connected to a main voltage rail (not shown), such as a 12 Volt rail, that serves as the main power source for DIMM 110. The main voltage rail may be connected to a main power source, such as a server-level power supply, as well as various backup power sources, such as server-level backup sources, rack-level backup sources, and/or building-level backup sources. Backup power source 120 may be electrically isolated from the main voltage rail by, for example, a diode and/or other electrical isolation. Backup power source 120 may provide backup power to DIMM 110 in response to a loss of voltage on the main voltage rail. Accordingly, in some examples, backup power source 120 may serve as a last line of defense against loss of data stored by DIMM 110 by providing backup power to DIMM 110 when all other main and backup sources fail.

As shown in FIG. 1, each DC-to-DC converter and battery cell pair may be electrically connected to the other DC-to-DC converter and battery cell pairs of backup power source 120 in parallel. The DC-to-DC converter may control the output voltage of the battery cell with which it is paired. By providing each battery cell with its own DC-to-DC converter, lower power and lower cost converters may be used.

The parallel connection between the DC-to-DC converter and battery cell pairs of backup power source 120 may prevent single-point failures from rendering backup power source 120 inoperable. For example, if battery cell 122A fails or discharges before battery cells 122B-122*n*, battery cells 122B-122*n* will still continue to operate and provide power to DIMM 110. Moreover, the parallel connection between the DC-to-DC converter and battery cell pairs of backup power source 120 eliminates the need for battery cell matching and balancing that is found in series-connected backup power sources.

Figure 2:
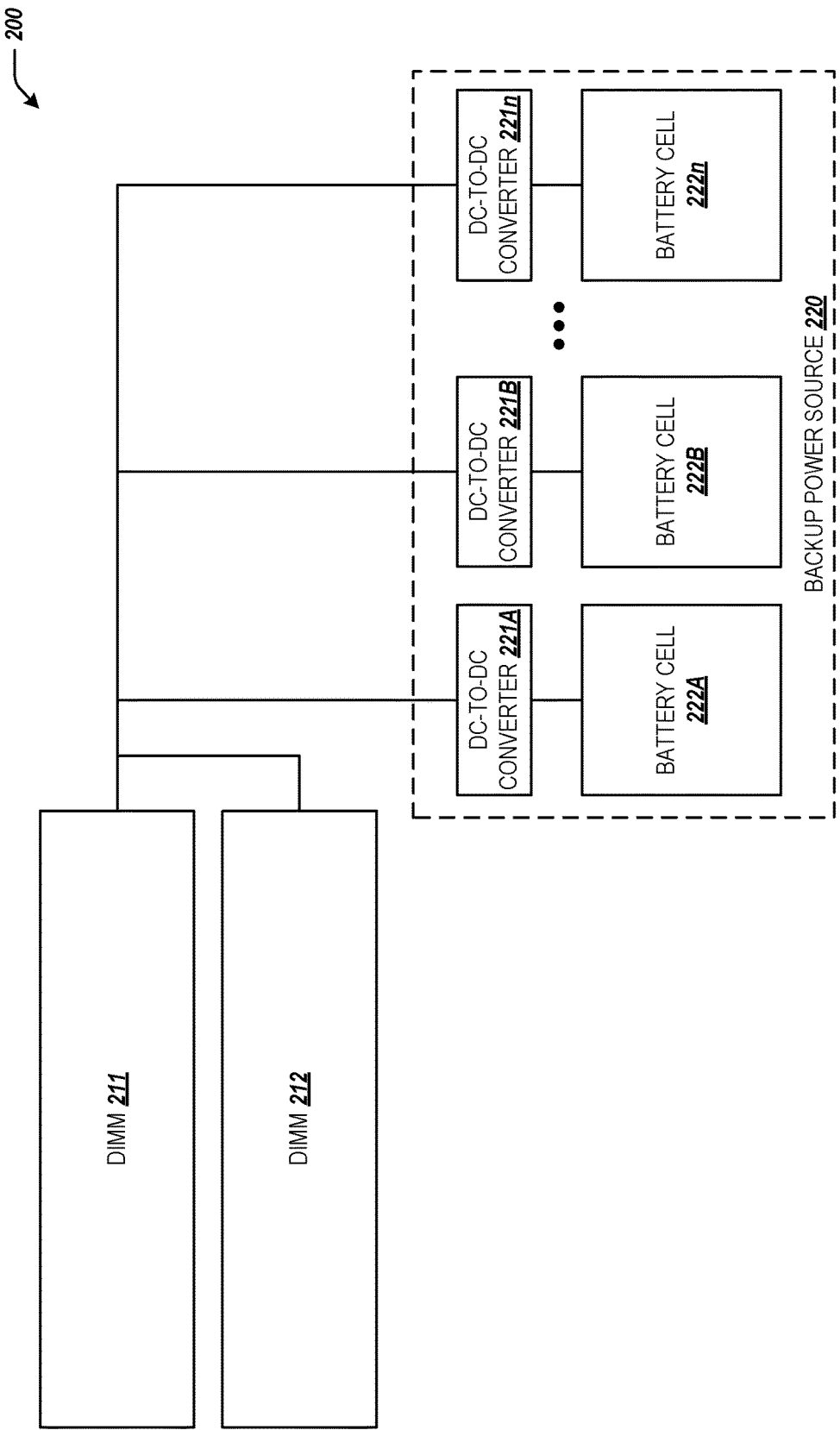
FIG. 2 is a block diagram of an example system for DIMM battery backup.

FIG. 2 is a block diagram of an example computing system 200 for memory module battery backup. Computing system 200 may be similar in configuration to computing system 100, except that computing system 200 may include a plurality of DIMMs (e.g., DIMM 211 and DIMM 212). The number and arrangement of these components is an example only and provided for purposes of illustration. Other arrangements and numbers of components may be utilized without departing from the examples of the present disclosure. For example, while FIG. 2 shows computing system 200 including two DIMMs, computing system 200 may include more than two DIMMs.

As shown in FIG. 2, backup power source 220 (and thus DC-to-DC converters 221A-221*n* and battery cells 222A-222*n*) may be electrically connected to DIMM 211 and DIMM 212 in parallel. The parallel connection between the DC-to-DC converter and battery cell pairs of backup power source 220, and the parallel connection between backup power source 220 and DIMMs 211 and 212, may prevent single-point failures from rendering backup power source 220 inoperable. For example, if battery cell 222A fails or discharges before battery cells 222B-222*n*, battery cells 222B-222*n* will still continue to operate and provide power to DIMMs 211 and 212.

Figure 3:
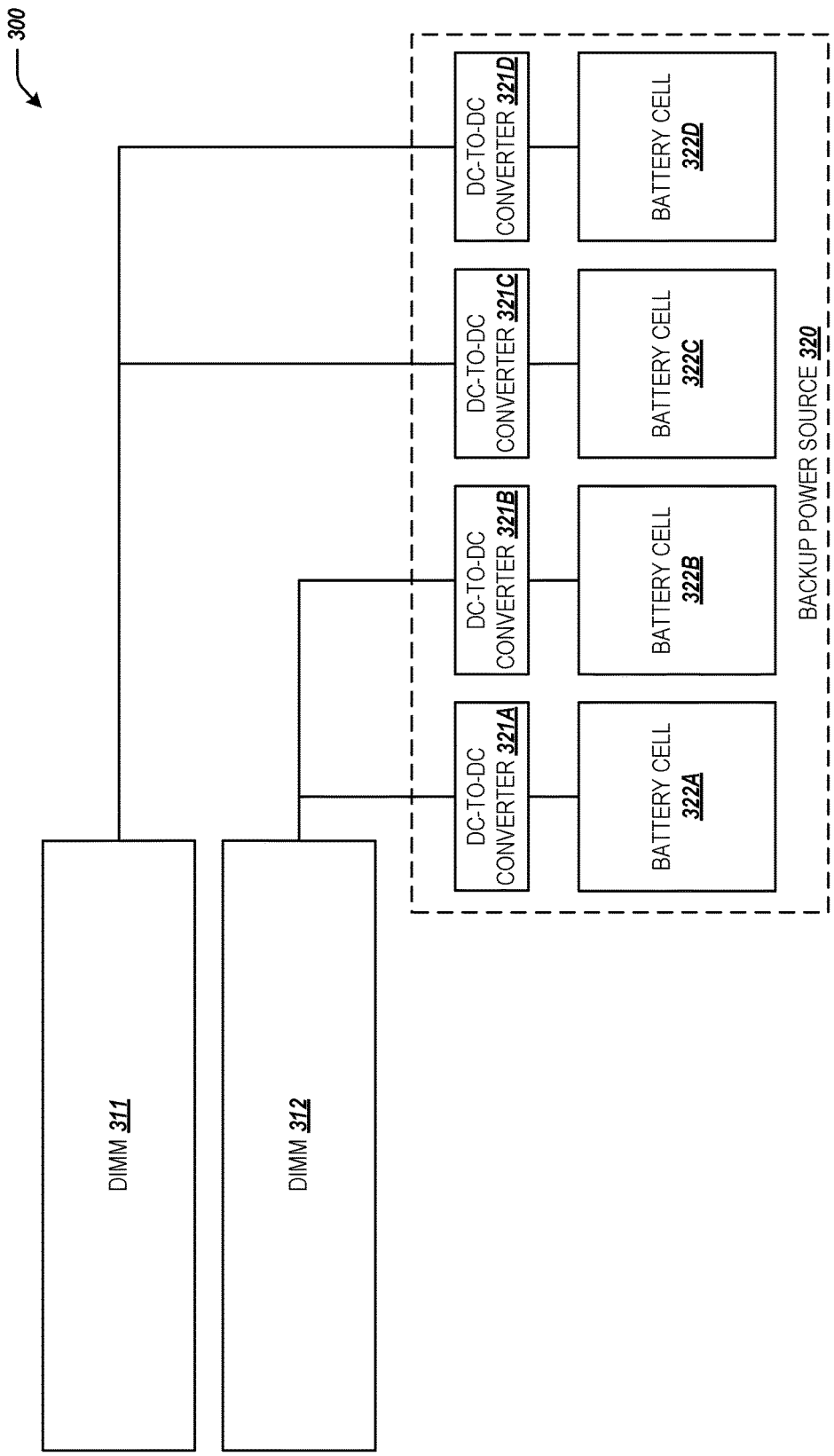
FIG. 3 is a block diagram of an example system for DIMM battery backup.

FIG. 3 is a block diagram of an example computing system 300 for memory module battery backup. Computing system 300 may include a plurality of DIMMs (e.g., DIMM 311 and DIMM 312) and a backup power source 320 that includes a plurality of DC-to-DC converters 321A-321D and a plurality of battery cells 322A-322D. The number and arrangement of these components is an example only and provided for purposes of illustration. Other arrangements and numbers of components may be utilized without departing from the examples of the present disclosure.

As shown in FIG. 3, each of DC-to-DC converters 321A-321D may be electrically connected to a battery cell 322A-322D in series. A first plurality of DC-to-DC converter and battery cell pairs (e.g., DC-to-DC converter 321A and battery cell 322A, and DC-to-DC converter 321B and battery cell 322B) may be electrically connected to each other in parallel and electrically connected to a first DIMM (e.g., DIMM 312). A second plurality of DC-to-DC converter and battery cell pairs (e.g., DC-to-DC converter 321C and battery cell 322C, and DC-to-DC converter 321D and battery cell 322D) may be electrically connected to each other in parallel and electrically connected to a second DIMM (e.g., DIMM 311). In some implementations, each of DC-to-DC converters 321A-321D may have the same power rating. In some implementations, at least two of DC-to-DC converters 321A-321D may have different power ratings. In some implementations, each of DC-to-DC converters 321A-321D may have different power ratings.

In some implementations, backup power source 320 may be a circuit card assembly that is pluggable into a DIMM slot of computing system 300. DC-to-DC converters 321A-321D and/or battery cells 322A-322D may be mounted on the circuit card assembly. When mounted in a DIMM slot of computing system 300, backup power source 320 may provide backup power to DIMMs 311 and 312. In some implementations, backup power source 320 may be implemented by electrical circuitry integrated into a motherboard of computing system 300. In some implementations, backup power source 320 may be implemented by electrical circuitry integrated into a circuit card assembly that is mounted on a motherboard of computing system 300.

DIMMs 311 and 312 may be connected to a main voltage rail (not shown), such as a 12 Volt rail, that serves as the main power source for DIMMs 311 and 312. The main voltage rail may be connected to a main power source, such as a server-level power supply, as well as various backup power sources, such as server-level backup sources, rack-level backup sources, and/or building-level backup sources. Backup power source 320 may be electrically isolated from the main voltage rail by, for example, a diode and/or other electrical isolation. Backup power source 320 may provide backup power to DIMMs 311 and 312 in response to a loss of voltage on the main voltage rail. Accordingly, in some examples, backup power source 320 may serve as a last line of defense against loss of data stored by DIMMs 311 and 312 by providing backup power to DIMMs 311 and 312 when all other main and backup sources fail.

Figure 4:
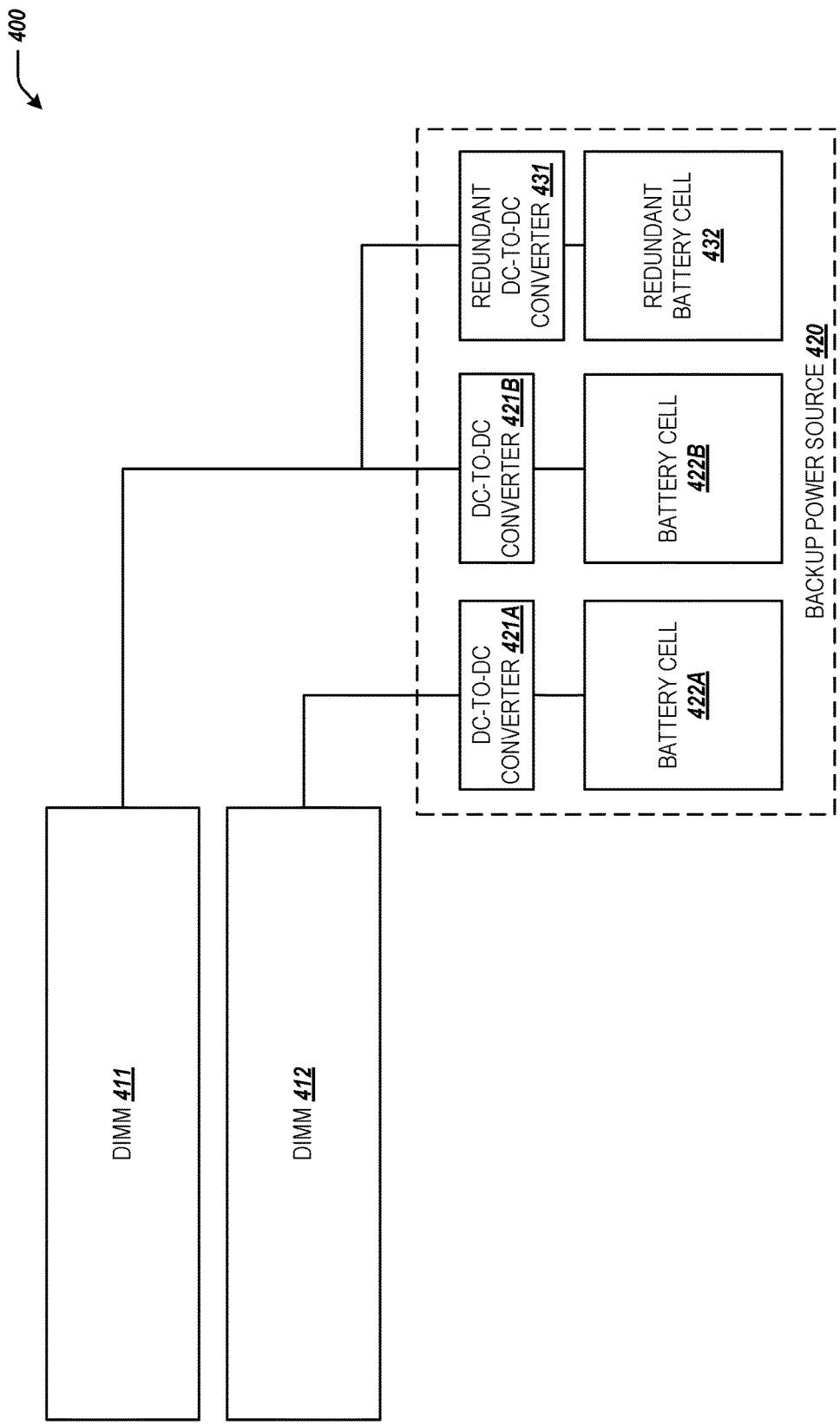
FIG. 4 is a block diagram of an example system for DIMM battery backup.

FIG. 4 is a block diagram of an example computing system 400 for memory module battery backup. Computing system 400 may include a plurality of DIMMs (e.g., DIMM 411 and DIMM 412) and a backup power source 420 that includes a plurality of DC-to-DC converters 421A and 421B, a plurality of battery cells 422A and 422B, a redundant DC-to-DC converter 431, and a redundant battery cell 432. The number and arrangement of these components is an example only and provided for purposes of illustration. Other arrangements and numbers of components may be utilized without departing from the examples of the present disclosure.

In some implementations, backup power source 420 may be a circuit card assembly that is pluggable into a DIMM slot of computing system 400. DC-to-DC converters 421A and 421B, battery cells 422A and 422B, redundant DC-to-DC converter 431, and redundant battery cell 432 may be mounted on the circuit card assembly. When mounted in a DIMM slot of computing system 400, backup power source 420 may provide backup power to DIMMs 411 and 412. In some implementations, backup power source 420 may be implemented by electrical circuitry integrated into a motherboard of computing system 400. In some implementations, backup power source 420 may be implemented by electrical circuitry integrated into a circuit card assembly that is mounted on a motherboard of computing system 400.

DIMMs 411 and 412 may be connected to a main voltage rail (not shown), such as a 12 Volt rail, that serves as the main power source for DIMMs 411 and 412. The main voltage rail may be connected to a main power source, such as a server-level power supply, as well as various backup power sources, such as server-level backup sources, rack-level backup sources, and/or building-level backup sources. Backup power source 420 may be electrically isolated from the main voltage rail by, for example, a diode and/or other electrical isolation. Backup power source 420 may provide backup power to DIMMs 411 and 412 in response to a loss of voltage on the main voltage rail. Accordingly, in some examples, backup power source 420 may serve as a last line of defense against loss of data stored by DIMMs 411 and 412 by providing backup power to DIMMs 411 and 412 when all other main and backup sources fail.

As shown in FIG. 4, each of battery cells 422A and 422B may be electrically connected to its own DC-to-DC converter in series. Each DC-to-DC converter and battery cell pair included in backup power source 420 may be electrically connected to a DIMM. For example, DC-to-DC converter 421A and battery cell 422A may be electrically connected to DIMM 412 and DC-to-DC converter 421B and battery cell 422B may be electrically connected to DIMM 411. Each of DC-to-DC converter 421A and 421B, and redundant DC-to-DC converter 431 may have the same or different power ratings.

Redundant battery cell 432 may be electrically connected to its own redundant DC-to-DC converter 431 in series. Moreover, the redundant DC-to-DC converter 431 and redundant battery cell 432 pair may be electrically connected to DC-to-DC converter and battery cell pairs included in backup power source 420 in parallel. Redundant battery cell 432 may be used to replace failed battery cells included in backup power source 420. As illustrated in the example shown in FIG. 4, redundant DC-to-DC converter 431 and redundant battery cell 432 may be electrically connected to the DC-to-DC converter 421B and battery cell 422B pair in parallel, and may take the place of DC-to-DC converter 421B and battery cell 422B in order to supply backup power to DIMM 411 if battery cell 422B fails, thereby improving the reliability of backup power source 420.

Figure 5:
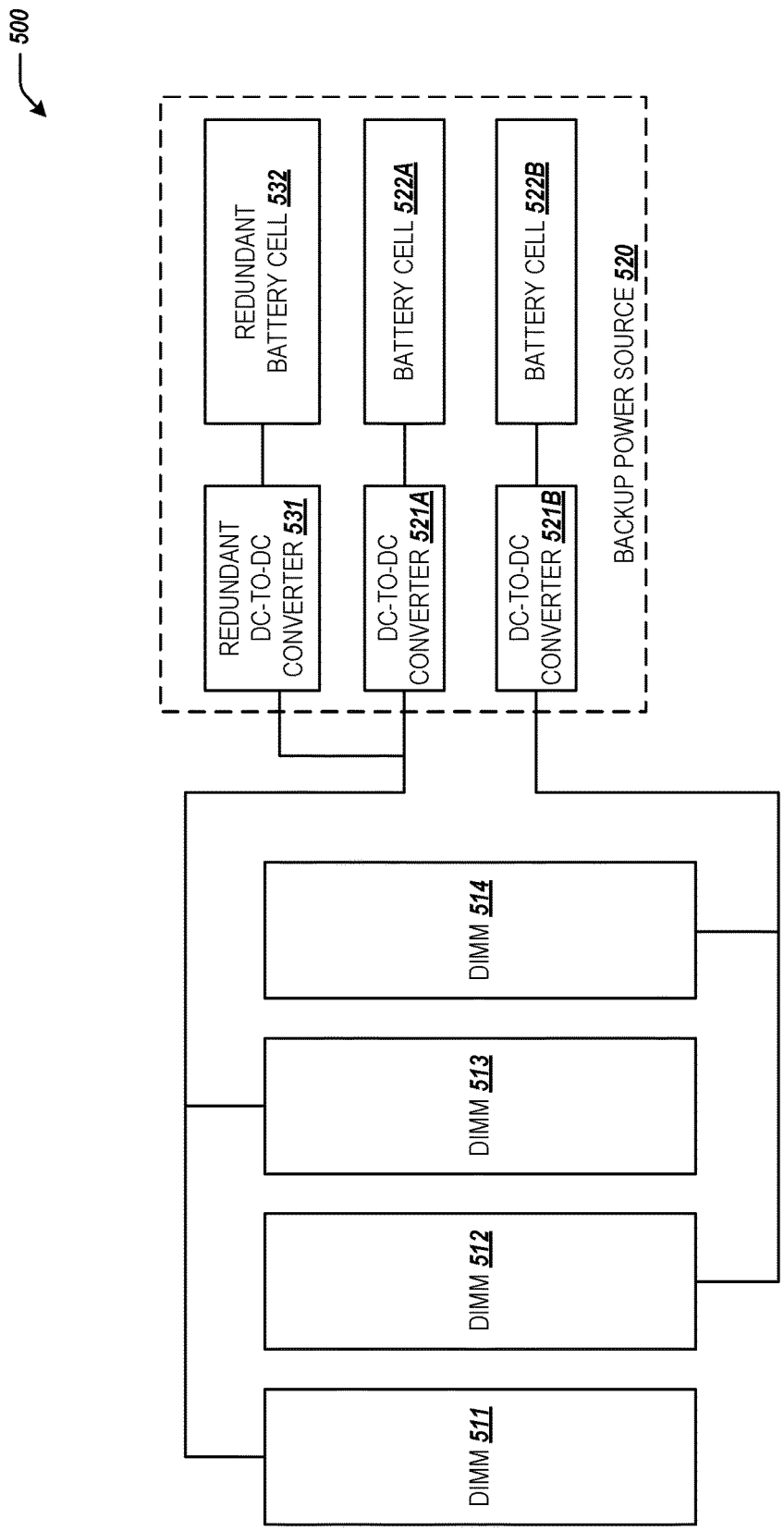
FIG. 5 is a block diagram of an example system for DIMM battery backup.

FIG. 5 is a block diagram of an example computing system 500 for memory module battery backup. Computing system 500 may be similar to computing system 400, except that each DC-to-DC converter and battery cell pair (e.g., DC-to-DC converter 521A and battery cell 522A, and DC-to-DC converter 521B and battery cell 522B) may be electrically connected to a plurality of DIMMs in parallel. The number and arrangement of these components is an example only and provided for purposes of illustration. Other arrangements and numbers of components may be utilized without departing from the examples of the present disclosure.

As shown in FIG. 5, DC-to-DC converter 521A and battery cell 522A may be electrically connected to DIMMs 511 and 513 in parallel, and DC-to-DC converter 521B and battery cell 522B may be electrically connected to DIMMs 512 and 514 in parallel. The DIMMs to which the DC-to-DC converter and battery cell pairs are connected may be interleaved with other DIMMs in computing system 500 such that, if a battery cell in backup power source 520 fails, the failure does not result in neighboring blocks of DIMMs being taken offline.

Redundant DC-to-DC converter 531 and redundant battery cell 532 may be electrically connected may be electrically connected to DC-to-DC converter and battery cell pairs included in backup power source 520 in parallel. Redundant battery cell 532 may be used to replace failed battery cells included in backup power source 520. As illustrated in the example shown in FIG. 5, redundant DC-to-DC converter 531 and redundant battery cell 532 may be electrically connected to the DC-to-DC converter 521A and battery cell 522A pair in parallel, and may take the place of DC-to-DC converter 521A and battery cell 522A in order to supply backup power to DIMM 511 and 513 if battery cell 522A fails, thereby improving the reliability of backup power source 520.

Figure 6:
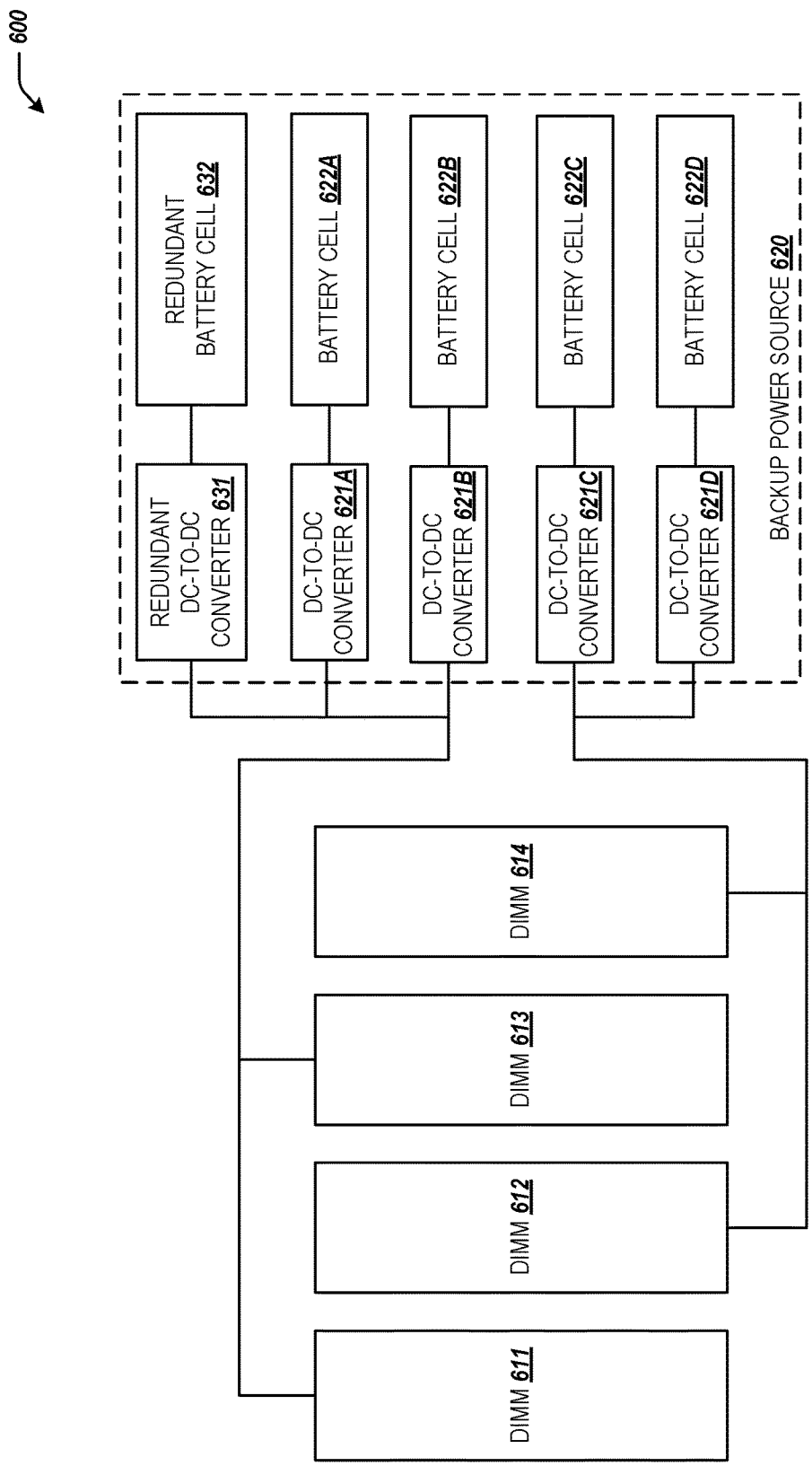
FIG. 6 is a block diagram of an example system for DIMM battery backup.

FIG. 6 is a block diagram of an example computing system 600 for memory module battery backup. Computing system 600 may be similar to computing system 500, except that a plurality of DC-to-DC converter and battery cell pairs (e.g., pairs of DC-to-DC converters 621A-621D and battery cells 622A-622D) may be electrically connected to a plurality of DIMMs (e.g., DIMMs 611-614) in parallel. The number and arrangement of these components is an example only and provided for purposes of illustration. Other arrangements and numbers of components may be utilized without departing from the examples of the present disclosure.

As shown in FIG. 6, DC-to-DC converter and battery cell pairs may be electrically connected to each other in parallel, and the parallel connected pairs may be electrically connected to a plurality of DIMMs in parallel. For example, DC-to-DC converter 621A and battery cell 622A may be electrically connected to DC-to-DC converter 621B and battery cell 622B in parallel and DC-to-DC converter 621C and battery cell 622C may be electrically connected to DC-to-DC converter 621D and battery cell 622D in parallel. The combination of DC-to-DC converter 621A, battery cell 622A, DC-to-DC converter 621B, and battery cell 622B may be electrically connected to DIMMs 611 and 613 in parallel, and the combination of DC-to-DC converter 621C, battery cell 622C, DC-to-DC converter 621D, and battery cell 622D may be electrically connected to DIMMs 612 and 614 in parallel.

Redundant DC-to-DC converter 631 and redundant battery cell 632 may be electrically connected may be electrically connected to DC-to-DC converter and battery cell pairs included in backup power source 620 in parallel. Redundant battery cell 632 may be used to replace failed battery cells included in backup power source 620. As illustrated in the example shown in FIG. 6, redundant DC-to-DC converter 631 and redundant battery cell 632 may be electrically connected to the DC-to-DC converter 621A and battery cell 622A pair and the DC-to-DC converter 621B and battery cell 622B pair in parallel, and may take the place of DC-to-DC converter 621A and battery cell 622A or DC-to-DC converter 621B and battery cell 622B in order to supply backup power to DIMM 511 and 513 if one of battery cell 622A and battery cell 622B fails, thereby improving the reliability of backup power source 620.

Figure 7:
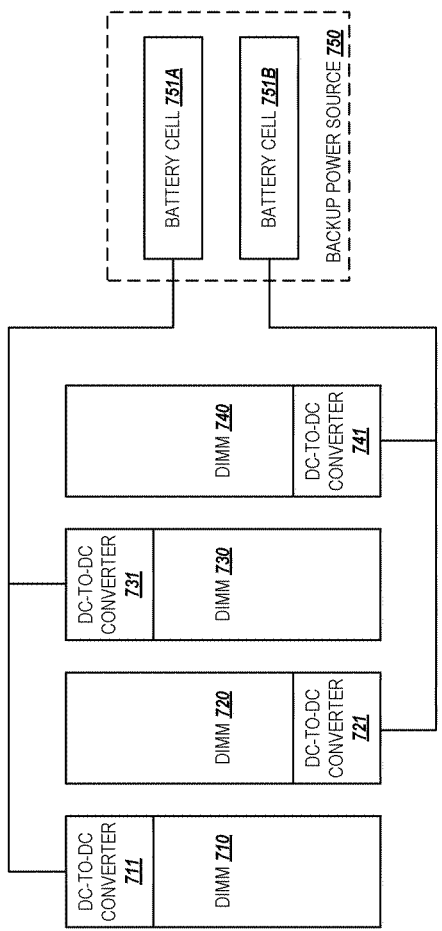
FIG. 7 is a block diagram of an example system for DIMM battery backup.

FIG. 7 is a block diagram of an example computing system 700 for memory module battery backup. Computing system 700 may include a plurality of DIMMs (e.g., DIMMs 710, 720, 730, and 740), a plurality of DC-to-DC converters 711, 721, 731, and 741, and a backup power source 750 that includes a plurality of battery cells 751A and 751B. The number and arrangement of these components is an example only and provided for purposes of illustration. Other arrangements and numbers of components may be utilized without departing from the examples of the present disclosure. As an example, backup power source 750 may include more than two battery cells. As another example, backup power source 750 may include a redundant DC-to-DC converter and a redundant battery cell electrically connected to the plurality of battery cells in parallel that serves as a backup to replace failed battery cells among the plurality of battery cells.

In some implementations, backup power source 750 may be a circuit card assembly that is pluggable into a DIMM slot of computing system 700. Battery cells 751A and 751B may be mounted on the circuit card assembly. When mounted in a DIMM slot of computing system 700, backup power source 750 may provide backup power to DIMMs 710, 720, 730, and 740. In some implementations, backup power source 750 may be implemented by electrical circuitry integrated into a motherboard of computing system 700. In some implementations, backup power source 750 may be implemented by electrical circuitry integrated into a circuit card assembly that is mounted on a motherboard of computing system 700.

DIMMs 710, 720, 730, and 740 may be connected to a main voltage rail (e.g., a 12 Volt rail) that serves as the main power source for DIMMs 710, 720, 730, and 740. The main voltage rail may be connected to a main power source, such as a server-level power supply, as well as various backup power sources, such as server-level backup sources, rack-level backup sources, and/or building-level backup sources. Backup power source 750 may be electrically isolated from the main voltage rail by, for example, a diode and/or other electrical isolation. Backup power source 750 may provide backup power to DIMMs 710, 720, 730, and 740 in response to a loss of voltage on the main voltage rail. Accordingly, in some examples, backup power source 750 may serve as a last line of defense against loss of data stored by DIMMs 710, 720, 730, and 740 by providing backup power to DIMMs 710, 720, 730, and 740 when all other main and backup sources fail.

As shown in FIG. 7, each of battery cells 751A and 751B may be electrically connected to a plurality of DC-to-DC converters in parallel. Each DC-to-DC converter and battery cell included in backup power source 750 may be electrically connected to a DIMM of computing system 700. For example, DC-to-DC converter 711 and battery cell 751A may be electrically connected to DIMM 710. Each of DC-to-DC converters 711, 721, 731, and 741 may have the same or different power ratings.

In some implementations, each of DC-to-DC converters 711, 721, 731, and 741 may be mounted on a separate DIMM among DIMMs 710, 720, 730, and 740. For example, DC-to-DC converter 711 may be mounted on DIMM 710, DC-to-DC converter 721 may be mounted on DIMM 720, DC-to-DC converter 731 may be mounted on DIMM 730, and DC-to-DC converter 741 may be mounted on DIMM 740.

The foregoing disclosure describes a number of example implementations for memory module battery backup. For purposes of explanation, certain examples are described with reference to the components illustrated in FIGS. 1-7. The functionality of the illustrated components may overlap, however, and may be present in a fewer or greater number of elements and components. Further, all or part of the functionality of illustrated elements may co-exist or be distributed among several geographically dispersed locations. Additional or fewer operations or combinations of operations may be used or may vary without departing from the scope of the disclosed examples. Furthermore, implementations consistent with the disclosed examples need not perform the sequence of operations in any particular order. Thus, the present disclosure merely sets forth possible examples of implementations, and many variations and modifications may be made to the described examples. All such modifications and variations are intended to be included within the scope of this disclosure and protected by the following claims.

The invention claimed is:
1. A system, comprising:
a plurality of dual in-line memory modules (DIMMs); and
a backup power source electrically isolated from a main voltage rail of the DIMMs and electrically connected to the DIMMs to provide backup power to the DIMMs in response to a loss of voltage on the main voltage rail, the backup power source including:
a plurality of battery cells electrically connected to each other in parallel, each of the plurality of battery cells being electrically connected to a plurality of DC-to-DC converters.

2. The system of claim 1, wherein each of the plurality of battery cells are connected to separate DC-to-DC converters.

3. The system of claim 2, wherein at least two of the separate DC-to-DC converters have different power ratings.

4. The system of claim 2, wherein each of the separate DC-to-DC converters have different power ratings.

5. The system of claim 1,
wherein the plurality of battery cells is a first plurality of battery cells, the backup power source includes a second plurality of battery cells electrically connected to each other in parallel, and the first plurality of battery cells is electrically connected to a first DIMM among the plurality of DIMMs and the second plurality of batter cells is electrically connected to a second DIMM among the plurality of DIMMs.

6. The system of claim 5, wherein:
each of the second plurality of battery cells is electrically connected to a DC-to-DC converter in series; and
the DC-to-DC converters connected to each of the first plurality of battery cells has a power rating different from the power rating of the DC-to-DC converters connected to each of the second plurality of battery cells.

7. The system of claim 1, wherein each of the plurality of battery cells is connected to at least two of the plurality of DIMMs in parallel.

8. The system of claim 7, wherein the at least two of the plurality of DIMMs to which each of the plurality of battery cells are connected are interleaved with other DIMMs in the plurality of DIMMs.

9. The system of claim 1, wherein a second battery cell among the plurality of battery cells is a backup for a first battery cell among the plurality of battery cells.

10. The system of claim 1, wherein each of the plurality of DC-to-DC converters are located on the plurality of DIMMs.

11. The system of claim 10, wherein each of the plurality of DC-to-DC converters are located on separate DIMMs among the plurality of DIMMs.

12. The system of claim 1, wherein the backup power source is mounted in a DIMM slot of the system.

13. The system of claim 1, wherein the plurality of DC-to-DC converters have a same power rating.

14. The system of claim 1, wherein the plurality of DC-to-DC converters have different power ratings.

15. The system of claim 1, further comprising a redundant battery cell electrically connected to the plurality of battery cells in parallel to replace a failed battery cell among the plurality of battery cells.

16. The system of claim 1, wherein the plurality of DC-to-DC converters are connected in parallel.

17. The system of claim 1, wherein the backup power source is electrically connected to the DIMMS in parallel.

18. A system, comprising:
a plurality of dual in-line memory modules (DIMMs); and
a backup power source electrically isolated from a main voltage rail of the DIMMs and electrically connected to the motherboard to provide backup power to the DIMMs in response to a loss of voltage on the main voltage rail, the backup power source including:
a plurality of battery cells electrically connected to each other in parallel, each of the plurality of battery cells being electrically connected to a plurality of DC-to-DC converters.

19. The system of claim 18, wherein the backup power source includes electrical circuitry integrated into a circuit card assembly that is mounted on the motherboard.

20. The system of claim 18, wherein the backup power source includes electrical circuitry integrated into the motherboard.

* * * * *